United States Patent [19]

Mermelstein

[11] Patent Number: 4,769,599
[45] Date of Patent: Sep. 6, 1988

[54] MAGNETOMETER WITH MAGNETOSTRICTIVE MEMBER OF STRESS VARIABLE MAGNETIC PERMEABILITY

[75] Inventor: Marc D. Mermelstein, Chevy Chase, Md.

[73] Assignee: Geo-Centers, Inc., Newton Centre, Mass.

[21] Appl. No.: 835,545

[22] Filed: Mar. 3, 1986

[51] Int. Cl.[4] .................. G01R 33/02; H01L 41/04; H02N 2/00

[52] U.S. Cl. .................................. 324/244; 310/323

[58] Field of Search .............. 324/209, 244; 335/3, 335/215; 365/157; 360/113; 310/323, 328, 321

[56] References Cited

U.S. PATENT DOCUMENTS

| | | | |
|---|---|---|---|
| 2,334,593 | 11/1943 | Wyckoff | 324/258 |
| 2,834,943 | 5/1958 | Grisdale et al. | 310/328 |
| 4,065,757 | 12/1977 | Kardashian | 335/3 |
| 4,142,571 | 3/1979 | Narasimhan | 164/88 |
| 4,443,731 | 4/1984 | Butler et al. | 310/26 |

OTHER PUBLICATIONS

"Proposal for Detection of Magnetic Fields Through Magnetostrictive Perturbation of Optical Fibers," Amnon Yariv, Harry V. Winsor, Optics Letters, vol. 5, No. 3, Mar. 1980, pp. 87–89.

"Metallic–Glass Fiber Optic Phase Modulators," Frank R. Trowbridge, Ronald L. Phillips, Optics Letters, vol. 6, No. 12, Dec. 1981, pp. 636–638.

*Primary Examiner*—Reinhard J. Eisenzopf
*Assistant Examiner*—Walter E. Snow
*Attorney, Agent, or Firm*—Wolf, Greenfield & Sacks

[57] ABSTRACT

A highly sensitive magnetometer employs a magnetostrictive amorphous metal core in which a piezoelectric driver induces stress variations. In the presence of an external magnetic field, the magnetization of the magnetostrictive core varies in relation to the induced stress. The amplitude of the variations in magnetization is proportional to the strength of the external field and is sensed by a pick-up winding disposed around the magnetostrictive core. The dynamic range of the device is improved by employing a bucking field winding around the core to null out the magnetization of the core. In contrast to the inherent non-linear characteristic of the conventional fluxgate magnetometer, the invention inherently provides a linear response to magnetic field strength.

15 Claims, 4 Drawing Sheets

MAGNETOMETER WITH MAGNETOSTRICTIVE MEMBER OF STRESS VARIABLE MAGNETIC PERMEABILITY

U.S. GOVERNMENT RIGHTS IN THE INVENTION

This invention was made by an employee of Geo-Centers, Inc., who was in the performance of work under Naval Research Laboratory's contract N00014-84-C-2399 with Geo-Centers. The United States of America has certain rights in the invention arising out of that contract, including a nonexclusive, nontransferable, irrevocable, paid-up license to practice the invention or have it practiced for or on behalf of the United States throughout the world.

FIELD OF THE INVENTION

This invention relates in general to apparatus for the detection of magnetic fields and the measurement of their intensities. More particularly, the invention pertains to the detection and measurement of DC and low frequency magnetic fields by a magnetometer employing a novel arrangement in which the amplitude of stress-induced magnetic flux variations in a magnetostrictive element is changed by the magnetic field being measured and the change is detected through the electric signal induced in a pick-up coil surrounding the magnetostrictive element. Because the invention is in many respects comparable to the type of magnetometer known as the "fluxgate" type, the device of the invention has been named "the magnetostrictive fluxgate magnetometer".

BACKGROUND OF THE INVENTION

The conventional fluxgate magnetometer depends for its operation upon the rapid AC magnetization of a pair of high permeability cores. Each core carries a primary winding and a secondary winding, one being disposed inside the other. Upon the flow of AC current through the primary windings, the cores are magnetized. The fluctuating magnetization induces currents in the secondary windings. If a DC external field (i.e. the signal field) is present, the magnetization of the core is increased by the external field when the AC magnetic field is in the same direction as the DC field and is decreased when the AC magnetic field in the opposite direction. By employing two cores and arranging their AC fields to be 180° out of phase, the signal obtained from the connected secondary windings is doubled for a DC external field of constant intensity.

Fluxgate magnetometers are commonly employed for the detection and measurement of weak magnetic fields. Because of their sensitivity fluxgate magnetometers are useful for detecting buried or sunken objects whose presence affects the local magnetic field. Because of their directional properties, fluxgate magnetometers have been employed as magnetic compasses.

A major drawback of conventional fluxgate magnetometers is that their response to magnetic field strength is non-linear because of the inherent characteristics of the core material. Consequently, magnetic field strength signals obtained from the conventional fluxgate magnetometer require sophisticated processing to assure the accuracy of measurement.

OBJECTS OF THE INVENTION

The principal object of the invention is to provide an improved fluxgate type magnetometer for the detection and measurement of DC and low frequency magnetic fields.

Another object of the invention is to provide a magnetometer having the sensitivity to detect and measure magnetic fields of lower strength than those detectable and measureable by conventional fluxgate magnetometers.

A further object of the invention is to provide a magnetometer whose signal processing requirement are less complex compared to the requirements of conventional fluxgate magnetometers because the invention utilizes a core characteristic that is intrinsically linear whereas the core characteristic utilized in the conventional fluxgate magnetometer is intrinsically non-linear.

THE CONVENTIONAL FLUXGATE MAGNETOMETER

Figure 1:
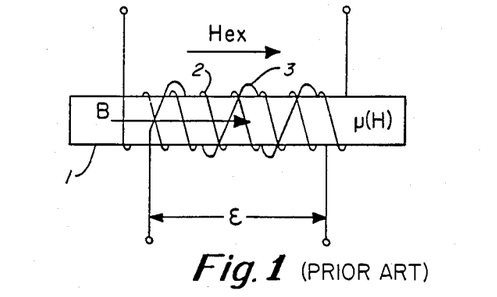
FIG. 1 schematically depicts a rudimentary arrangement for a conventional fluxgate magnetometer.

FIG. 1 shows the rudimentary arrangement of a magnetometer of the conventional fluxgate type. The simple fluxgate magnetometer shown in FIG. 1, depends for its operation on the AC magnetization of a core 1 of high magnetic permeability by a signal coil 2 surrounding the core. Disposed around the signal coil 2 is a pick-up coil 3. Changes in the magnetic flux $\Phi$ in the core induce an electromotive force (emf) $\epsilon$ in the pick-up coil 3. That induced signal in the pick-up coil is subsequently processed to obtain a voltage that is a measure of magnetic field intensity. The emf $\epsilon$ is given by Faraday's law of electric induction.

$$\epsilon = N\frac{d\Phi}{dt} \quad (1)$$

where N is the number of turns of the pick-up coil. The magnetic flux $\phi$ is equal to the product of the magnetic induction B and the cross-sectional area A of the core. Hence, the emf may be rewritten as $$\epsilon = NA\frac{dB}{dt} \quad (2)$$

The magnetic field intensity B inside the core is given by $$B = \mu_o(H+M) \quad (3)$$

where
H is the magnetic field strength
M is the magnetization, and
$\mu_o$ is the permeability of free space.

The magnetization M of the conventional fluxgate magnetometer core is given by $$M = \chi H \quad (4)$$

where the constant of proportionality between the field strength H and the magnetization M is the susceptibility $\chi$. Substituting equation (4) into equation (3) yields the relation between the magnetic induction B and field strength H which is $$B = \mu H \quad (5)$$

where the magnetic permeability $\mu$ is defined as $$\mu = \mu_o(1+\chi) \quad (6)$$

Figure 2:
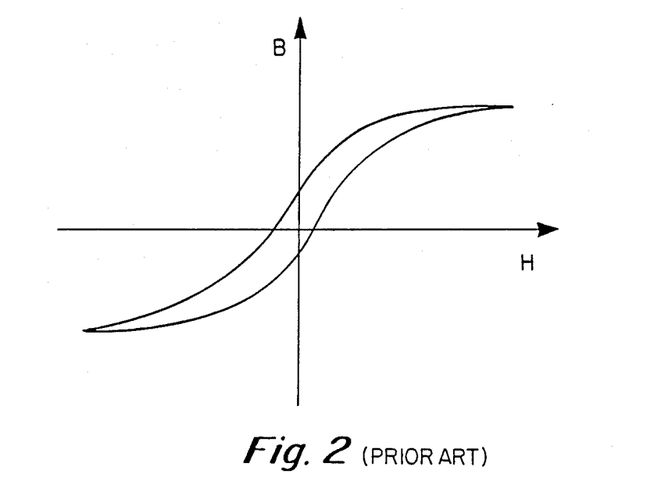
FIG. 2 shows the B vs H hysteresis loop for magnetic material of the kind typically employed in the conventional fluxgate magnetometer.

In general, $\mu = \mu(H)$ is a non-linear function of the field strength. This is readily seen when plotting the B versus H hysteresis loop of a typical magnetic core material. FIG. 2 shows such a plot. In that plot, the permeability $\mu$ is the slope of the loop and is a function of the field strength H. Substituting equation (5) into equation (2) yields $$\epsilon = NAH\frac{d\mu}{dt} + NA\mu\frac{dH}{dt} \quad (7)$$

where allowance has been made for time variations in $\mu$ and H. Time variations are introduced to the permeability $\mu(H)$ by imposing a time dependent field $H_1(t)$ in addition to the magnetic strength $H_o$ of the signal field which is either a DC field or a low frequency AC field. the total field strength H is $$H = H_o + H_1(t) \quad (8)$$

Substituting equation (8) into equation (7) yields $$\epsilon = NA(H_o + H_1)\frac{d\mu}{dt} + NA\mu\frac{dH_1}{dt} \quad (9)$$

Figure 3:
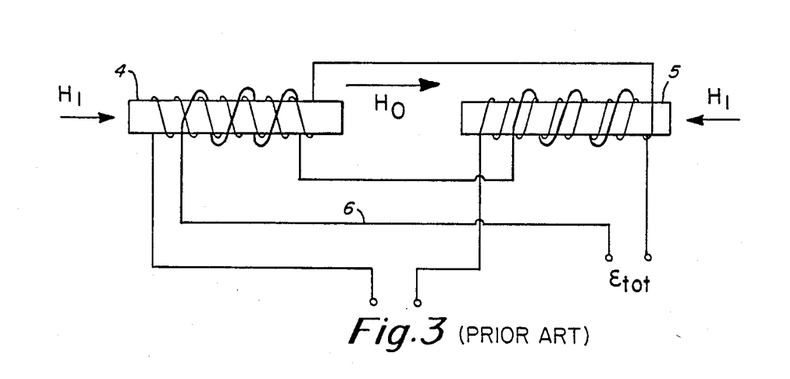
FIG. 3 schematically depicts the arrangement of a conventional fluxgate magnetometer.

If, as shown in FIG. 3, a second core 5 with a magnetizing field $H_1$ that is 180° out of phase with the magnetic field $H_1$ of first core 4 is placed within the pick-up coil 6, the emf due to that second core is given by $$\epsilon = NA(H_o - H_1)\frac{d\mu}{dt} - NA\mu\frac{dH_1}{dt} \quad (10)$$

The total emf is the sum of equations (9) and (10) and is given by $$\epsilon_{tot} = NAH_o\frac{d\mu[H(t)]}{dt} \quad (11)$$

Hence the total emf is due to the flux change resulting from the presence of the low frequency signal field $H_o$ and the change is magnetic permeability $\mu(H)$.

The time dependence of the permeability of the conventional fluxgate magnetometer is expressed explicitly in the following equation $$\epsilon_{tot} = NAH_o\left(\frac{d\mu}{dH_1}\right)H_1\left(\frac{dH_1}{dt}\right) \quad (12)$$

That basic fluxgate equation shows that the emf induced in the pick-up coil 6 as a result of the time varying permeability is proportional to the low frequency signal field $H_o$. It is immediately clear that processing of the signal emf is greatly complicated by the non-linear behavior of the $d\mu/dH_1$ term.

DETAILED DESCRIPTION OF INVENTION EMBODIMENTS

Figure 4:
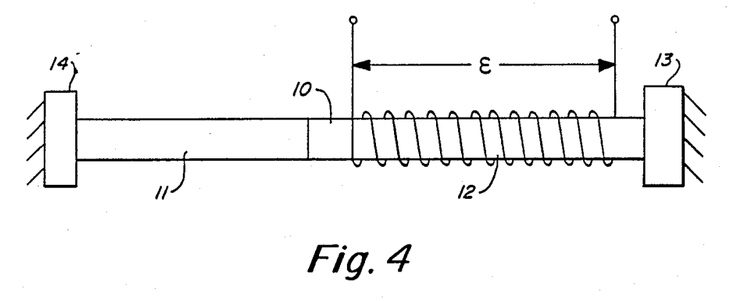
FIG. 4 shows the scheme of a rudimentary embodiment of the invention employing a magnetostrictive ribbon core.

In contrast to the conventional fluxgate magnetometer, the invention utilizes a core having an altogether different physical characteristics—i.e. the characteristic of magnetostriction. In the embodiment of the invention shown in FIG. 4, the core 10 is constituted of a magnetostrictive element. The core element preferably is a magnetostrictive material such as Metglas 2605S2 which is an amorphous metal substance made by Metglas Products of Parsippany, N.J. that is sold in the form of a ribbon. The magnetization in the magnetostrictive amorphous metal core is given by $$M = \chi_o^\sigma H + \mu_o^{-1} d^H \sigma \quad (13)$$

where
$\chi_o^\sigma$ is the magnetic susceptability at constant stress,
$d^H$ is the piezomagnetic modulus at constant field strength.

The two coefficients in the above constitutive relation may be estimated from the dipole rotation model for the magnetostrictive amorphous metal ribbon core. They are found to be $$\chi_o^\sigma = \frac{M_D}{H_A}$$

and $$d^H = \frac{3\lambda_s H_o}{H_A^2}$$

where
$M_D$ is the length of the domain magnetization vector,
$H_A$ is is the anisotropy field,
$\lambda_s$ is the magnetostrictive constant, and
$H_o$ is the low frequency signal field.

Application of a time dependent stress $\sigma(t)$ to the magnetostrictive ribbon core 10 by a piezoelectric driver 11 allows the development of a time dependent magnetization whose amplitude is proportional to the signal magnetic field $H_o$. The magnetic induction B is found from equations (3) and (13) to be $$B = \mu H + d^H \sigma(t) \quad (14)$$

where $$\mu = \mu_o(1 + M_D/H_A) \quad (15)$$

Having determined the magnetic induction B, the emf may be computed from equation (2). It is found to be $$\epsilon = NA\left(\frac{3\lambda_s}{H_A^2}\right)H_o\frac{d\sigma(t)}{dt} \quad (16)$$

Hence, the emf induced in the pick-up 12 is proportional to the signal field $H_o$.

A comparison of equation (16) with equation (12) facilitates a comparison of the magnetostrictive technique vis a vis the conventional fluxgate technique. Firstly, the time dependent saturating field strength $(dH_1/dt)$ in equation (12) is replaced by the time dependent stress field $(d\sigma/dt)$ in equation (16). More importantly, the non-linear field dependent term $H_o(d\mu/dH_1)$ in equation (12) is replaced by the simple linear term $3\lambda_s H_o/H_A^2$ in equation (16). The importance of this distinction is discussed herein in a subsequent passage.

In the rudimentary embodiment of the invention shown in FIG. 4, the core 10 is a magnetostrictive amorphous metal ribbon which is secured at one end to a rigid support 13. At its other end the ribbon 10 is attached to a piezoelectric driver 11 extending from a second support 14. A sinusoidally varying stress is applied to the taut ribbon by the piezoelectric driver upon which a varying voltage is impressed. The piezoelectric driver generates an internal stress field $\sigma(t)$ in the magnetostrictive ribbon. Preferably, the ribbon is driven at its resonant frequency $\omega_o$ corresponding to a sonic wave traveling longitudinal along the ribbon.

Examination of the domain constitutive equation (14) shows that a longitudinal magnetization will develop in the core as a result of the stress $\sigma$ only in the presence of a non-zero low frequency magnetic field $H_o$ (i.e. the signal field) inasmuch as the piezomagnetic modulus is proportional to $H_o$. Assuming a sinusoidal dependence to the stress field $$\sigma(t) = \sigma_o \sin \omega_o t \quad (17)$$

where $\sigma_o$ is the stress amplitude, the induced emf is found from equations (2) and (14) to be $$\epsilon(\omega) = \left[\frac{\omega_o NA3\lambda_s H_o \sigma_o}{H_A^2}\right]\cos wt \quad (19)$$

The amplitude $\epsilon_o$ of the emf is $$\epsilon_o = \frac{\omega_o NA3\lambda_s H_o\sigma_o}{H_A^2} \quad (19)$$

and can be readily detected using a lock-in amplifier (i.e. using phase sensitive detection techniques).

The sensitivity $\eta$ of the magnetostrictive fluxgate magnetometer is defined as the change is induced emf per change in the strength of the signal magnetic field.

$$\eta = \frac{\Delta\epsilon}{\Delta H_o} \quad (20\,a)$$

$$\eta = \frac{NA3\lambda_s \sigma_o \omega_o}{H_A^2} \quad (20\,b)$$

Assuming that the applied stress field has an amplitude $\sigma_o$ equal to 10% of the critical stress, $$\sigma_c = 0.7 \times 10^6 \frac{J}{m^3}$$

that the pick up coil has 1000 turns, that the ribbon has a width of 1 cm. and a thickness of 30 $\mu$m, that the magnetostriction constant $\lambda_s$ is 30 ppm, that the anisotropy field is 80 A/m and that the operating frequency is 10 kHz, the sensitivity is found to be $$\eta = 15\mu V/nT$$

Hence, a signal magnetic field of 1.0 nT will induce an emf of 15 $\mu$V which is readily detectable using conventional synchronous detection techniques.

Figure 5:
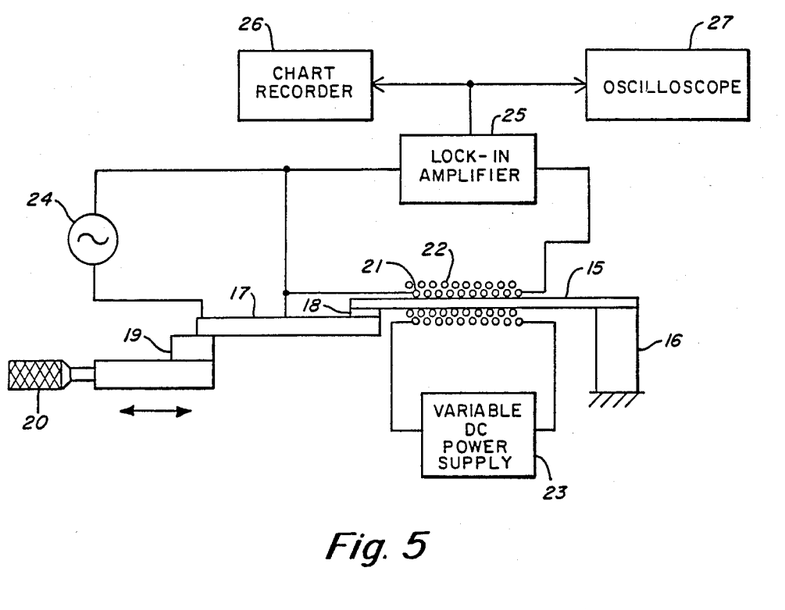
FIG. 5 schematically depicts a crude but operative embodiment of the invention that was actually built and tested.

FIG. 5 shows the scheme of a crude but operable embodiment of the invention that was actually constructed and tested. In that embodiment, the core 15 is a 2"×½" magnetostrictive amorphous metal ribbon (Metglas 2605S2) which was cut from a 2" wide ribbon roll. One end of the 2" long ribbon is secured to a stationary rigid support 16. The other end of the ribbon is cemented to a 30 mm×13 mmm×0.7 mm piezoelectric ceramic plate 17 having thereon spaced electrodes. The piezoelectric plate is made of PZT5A material. The magnetostrictive ribbon is secured by an epoxy adhesive to one 13 mm edge of the piezoelectric plate with a glass slip 18 interposed between the ribbon and the plate to electrically insulate the ribbon from the electroded surface of the piezoelectric plate. The opposite 13 mm edge of the piezoelectric plate is attached to an insulator block 19 mounted on a micropositioner 20. Adjustment of the micropositioner enables the amount of tension applied to the ribbon to be changed. Because the magnetoelastic response of the ribbon is dependent upon the equilibrium tension, the performance of the ribbon can be optimized by adjusting the micropositioner to provide the requisite tautness of the ribbon.

The ribbon is surrounded by two coils 21 and 22, one within the other. The coil 20 is a pick-up coil having 100 turns of copper wire. The coil 22 is a magnetic field producing device having about 20 turns of 0.35 mm diameter copper wire. A variable DC power source 23 supplies current to the coil 22 and produces a DC magnetic field which in MKS units is given by $$H = NI$$

where
 $N = 2.9 \times 10^3$ m$^{-1}$, and
 I is the current in amperes.

An oscillator 24 is connected to the piezoelectric plate and drives it at 100 KHz with an AC voltage of about 0.5 volt rms. The piezoelectric response of the plate stresses the magnetostrictive ribbon which, in the presence of the DC field established by coil 22, generates an emf in pick-up coil 21. That emf is detected by the lock-in amplifier 25 which is referenced to the piezoelectric ceramic plate 17 and monitored by a chart recorder 26 and an oscilloscope 27.

Figure 6:
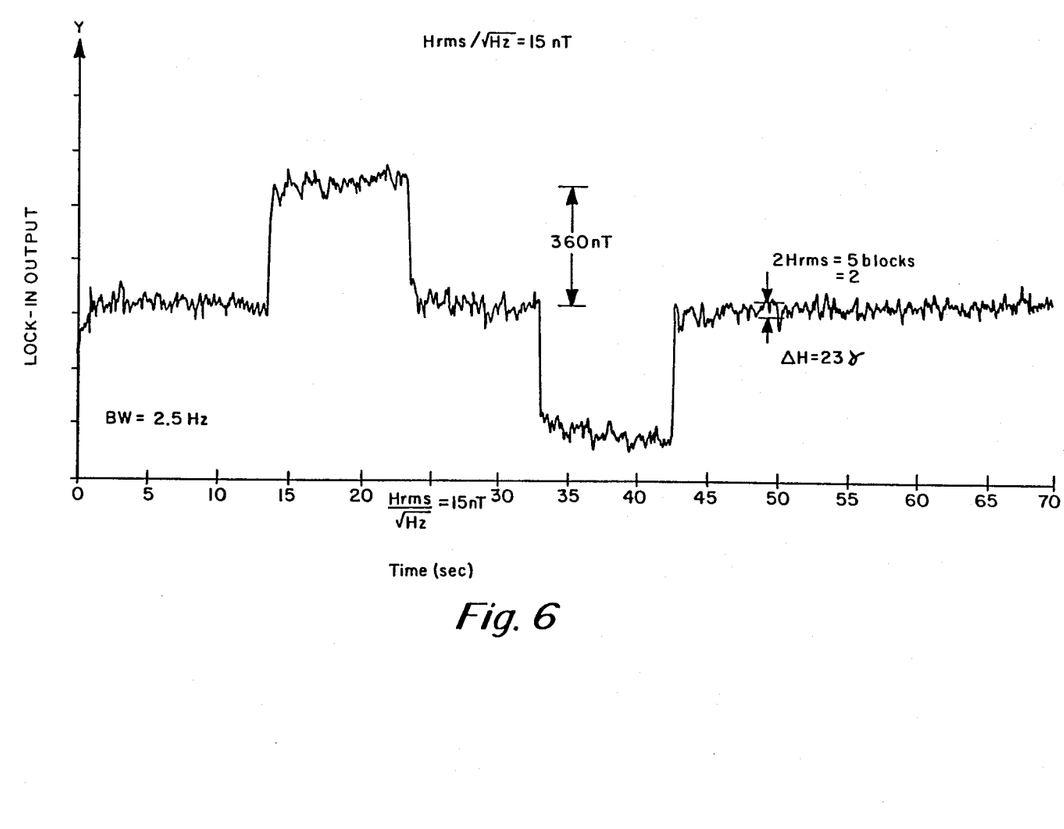
FIG. 6 is a chart of test data obtained with the FIG. 5 arrangement.

FIG. 6 is a chart of the magnetic field sensing data measured with the FIG. 5 arrangement. The data was taken in the following manner: the stress dither was applied to the ribbon by the piezoelectric driver and the oscillating emf was monitored by the oscilloscope. The DC bias field produced by coil 22 was adjusted to minimize the observed signal. This small stress-induced signal was simultaneously monitored by the lock-in amplifier 25 and the chart recorder 26. The current in the coil 22 was then changed by ±0.1 mA increments which corresponds to 360 nT steps in the DC magnetic field. The lock-in output reflects this change in the DC field. the minimum detectable magnetic field is taken to be equal to the approximate rms noise level of the lock-in output, i.e. unity signal to noise ratio. It is found to be approximately 15 nT/√Hz in the bandwidth from DC to 1 Hz.

Figure 7:
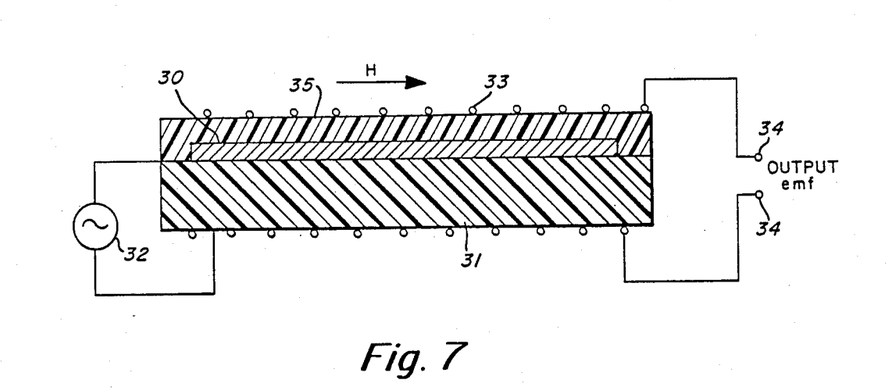
FIG. 7 is a more advanced embodiment of the invention that is exceptionally rugged because the device is virtually all solid state.

A more advanced embodiment of the invention is schematically depicted in FIG. 7. In that FIG. 7 embodiment, a film 30 of the magnetostrictive amorphous metal is deposited by sputtering or some other suitable deposition process upon the surface of a substrate 31 of a piezoelectric material such as quartz. A voltage from a source 32 is applied to the piezoelectric substrate 31 in a manner imposing a sinusoidally varying stress upon the magnetostrictive film 30. That varying stress, in turn, causes a corresponding variation in the magnetization of the film 30 in the presence of a DC magnetic field which is schematically represented in FIG. 7 by the H arrow.

Surrounding substrate 31 is a pick-up winding 33 which senses the variations in the magnetization of the film 30 by induction and provides an emf signal at output terminals 34. The magnetostrictive film 30 is covered by a thin coat 35 of an electrically insulative material deposited over the magnetostrictive film to insulate the pick-up winding 33 from the film 30. When necessary a thin insulator 36 may be interposed between the film 30 and the piezoelectric substrate 31, as indicated in the FIG. 8 embodiment. Major advantages of the FIGS. 7 and 8 embodiments are (1) the magnetometer can be exceptionally rugged because the device is virtually all solid state and (2) the magnetometer can be highly miniaturized because the component of greatest bulk is the piezoelectric substrate.

Figure 8:
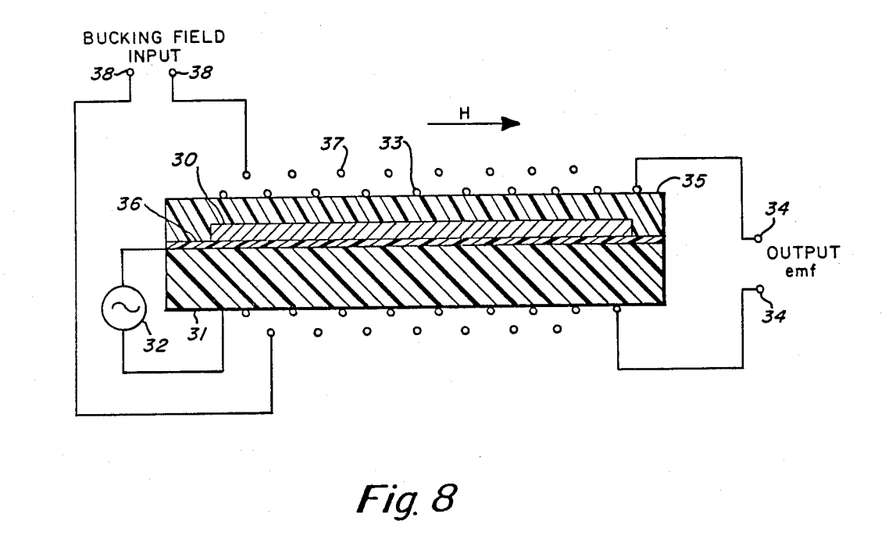
FIG. 8 is a variation upon the FIG. 7 embodiment which enables a magnetic field nulling technique to be used to increase the sensitivity of measurement

The dynamic range of the invention embodiments can be improved by using a "nulling" technique. When using that technique, the magnetic field H is nulled out by an opposing magnetic field established, as shown in FIG. 8, by a "bucking field" winding 37 disposed around the substrate 31. When the magnetization of film 30 is no longer detectable by the pick-up winding 33, the current applied at terminals 38 of the "bucking field" winding 37 is then a measure of the intensity of the H magnetic field.

Inasmuch as the invention can be embodied in various forms, it is not intended that the scope of the invention be limited only to the embodiments here described. It is intended rather, that the scope of the invention be construed in accordance with the appended claims, having due regard for obvious changes that do not depart from the essentials of the invention.

I claim:

1. A magnetometer for detecting an applied magnetic field comprising:
    a magnetostrictive element comprising a ribbon of an amorphous metal, said ribbon having a longitudinal axis extending between opposing ends;
    a piezoelectric driver;
    a rigid support;
    means for attaching the ribbon at opposing ends to the driver and support;
    means for applying an oscillating voltage to the driver such that the driver applies an oscillating dither stress to the ribbon which induces magnetization fluctuations in the ribbon of a magnitude proportional to the strength of the applied magnetic field;
    a pick-up coil surrounding the ribbon along the longitudinal axis wherein the magnetization fluctuations in the ribbon induce an electromotive force (EMF) in the pick-up coil; and
    means for detecting the EMF in the pick-up coil and referencing the same to the frequency of the oscillating voltage for producing an output signal proportional to the applied magnetic field.

2. The device of claim 1, further comprising a nulling circuit for keeping the ribbon within its linear magnetostrictive range and to avoid hysteresis effects by keeping the ribbon at essentially zero magnetic field, said nulling circuit comprising:
    a nulling coil surrounding the ribbon along the longitudinal axis;
    means for applying a current to the nulling coil for producing a nulling magnetic field which opposes and substantially cancels the applied magnetic field so that the field applied to the ribbon is substantially zero; and
    means for measuring the current applied to the nulling coil to thereby determine the amplitude of the applied magnetic field.

3. The device of claim 1, wherein the amorphous metal is a metallic glass.

4. The device of claim 3, wherein the metallic glass is Metglas.

5. The device of claim 4, wherein the metallic glass is Metglas 2605S2.

6. The magnetometer of claim 1, wherein the driver is made of PZT.

7. The magnetometer of claim 1, wherein the means for applying the oscillating voltage provides a voltage at a frequency of about the longitudinal resonant frequency of the ribbon as attached to the driver.

8. The device of claim 1, wherein the magnetometer has a sensitivity of at least about 15 $\mu$V/nT.

9. The magnetometer of claim 1, wherein the minimum detectable magnetic field is no greater than about 15 nT/√Hz in the bandwidth from DC to 1 Hz.

10. The magnetometer of claim 1, further comprising means for adjusting the equilibrium of the ribbon.

11. The magnetometer of claim 10, wherein the adjusting means permits adjustment of the position of the driver or support so as to vary the equilibrium tension of the ribbon.

12. The magnetometer for detecting an applied magnetic field comprising:
    a piezoelectric substrate;
    a magnetostrictive element comprising a film of an amorphous metal applied to a surface of the substrate, said film having a longitudinal axis;
    means for applying an oscillating voltage to the substrate such that the substrate applies an oscillating dither stress to the film which induces magnetization fluctuations in the film of a magnitude proportional to the strength of the applied magnetic field;
    a pick-up coil surrounding the substrate and film along the longitudinal axis wherein the magnetization fluctuations in the film induce an electromotive force (EMF) in the pick-up coil; and
    means for detecting the EMF in the pick-up coil and referencing the same to the frequency of the oscillating voltage for producing an output signal proportional to the applied magnetic field.

13. The magnetometer of claim 12, further comprising a first electrical insulator positioned between the film and the pick-up coil.

14. The magnetometer of claim 13, further comprising a second electrical insulator positioned between the film and substrate.

15. The device of claim 12, further comprising a nulling circuit for keeping the film within its linear magnetostrictive range and to avoid hysteresis effects by keeping the film at essentially zero magnetic field, said nulling circuit comprising:

a nulling coil surrounding the film and substrate along the longitudinal axis;

means for applying a current to the nulling coil for producing a nulling magnetic field which opposes and substantially cancels the applied magnetic field so that the field applied to the film is substantially zero; and means for measuring the current applied to the nulling coil to thereby determine the amplitude of the applied magnetic field.

* * * * *

UNITED STATES PATENT AND TRADEMARK OFFICE
CERTIFICATE OF CORRECTION

PATENT NO. : 4,769,599

DATED : September 6, 1988

INVENTOR(S) : Marc D. Mermelstein

It is certified that error appears in the above-identified patent and that said Letters Patent is hereby corrected as shown below:

Title of invention should read -- MAGNETOMETER WITH MAGNETOSTRICTIVE MEMBER OF MAGNETIC FIELD VARIABLE PIEZOMAGNETIC MODULUS --.

Signed and Sealed this

Fifteenth Day of November, 1988

Attest:

DONALD J. QUIGG

*Attesting Officer*  *Commissioner of Patents and Trademarks*